United States Patent
Hassner et al.

(10) Patent No.: US 9,530,442 B1
(45) Date of Patent: Dec. 27, 2016

(54) ENHANCED LOW OVERHEAD DATA PROTECTION IN DATA STORAGE DRIVES

(71) Applicant: HGST Netherlands B.V., Amsterdam (NL)

(72) Inventors: Martin Hassner, Mountain View, CA (US); Satoshi Yamamoto, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 14/863,378

(22) Filed: Sep. 23, 2015

(51) Int. Cl.
  *G11B 5/09* (2006.01)
  *G11B 5/596* (2006.01)
  *G11B 20/18* (2006.01)

(52) U.S. Cl.
  CPC ....... *G11B 5/59627* (2013.01); *G11B 20/1833* (2013.01)

(58) Field of Classification Search
  None
  See application file for complete search history.

(56) References Cited

U.S. PATENT DOCUMENTS

| | | | |
|---|---|---|---|
| 8,683,295 B1 | 3/2014 | Syu et al. | |
| 8,699,162 B1 | 4/2014 | Grobis et al. | |
| 8,976,478 B1 | 3/2015 | Harllee et al. | |
| 8,988,800 B1 | 3/2015 | Varnica et al. | |
| 2004/0193798 A1* | 9/2004 | Kuwamura | G11B 19/04 711/114 |
| 2011/0103297 A1* | 5/2011 | Saito | H04B 7/15592 370/315 |
| 2013/0166945 A1* | 6/2013 | Nakao | G06F 11/1088 714/6.21 |
| 2015/0089317 A1 | 3/2015 | Patapoutian et al. | |
| 2015/0109701 A1 | 4/2015 | Brunnett et al. | |
| 2015/0128008 A1 | 5/2015 | Chatradhi et al. | |
| 2015/0254135 A1* | 9/2015 | Chatradhi | G06F 11/1076 714/764 |

* cited by examiner

*Primary Examiner* — Peter Vincent Agustin

(57) ABSTRACT

To provide enhanced operation of data storage devices and systems, various systems, apparatuses, methods, and software are provided herein. In a first example, a data storage device is presented that performs a write process to store data on a storage medium of the data storage device responsive to one or more write operations received over a host interface. The data storage device monitors a quality of the write process and determines when the quality of the write process falls below a threshold quality. Responsive to the quality of the write process falling below the threshold quality, the data storage device indicates the quality of the write process to a data protection node that determines data parity information for the data to compensate for the quality of the write process. The data storage device receives the data parity information and stores the data parity information.

18 Claims, 7 Drawing Sheets

ENHANCED LOW OVERHEAD DATA PROTECTION IN DATA STORAGE DRIVES

TECHNICAL FIELD

Aspects of the disclosure are related to the field of data storage and data storage drives in data storage systems.

TECHNICAL BACKGROUND

Computer and network systems such as personal computers, workstations, server systems, and cloud storage systems, typically include data storage devices for storing and retrieving data. These data storage devices can include hard disk drives (HDDs), solid state storage drives (SSDs), tape storage devices, optical storage drives, hybrid storage devices that include both rotating and solid state data storage elements, and other mass storage devices.

As computer systems and networks grow in numbers and capability, there is a need for more and more storage capacity. Cloud computing and large-scale data processing systems have further increased the need for digital data storage systems capable of transferring and holding immense amounts of data. Data centers can include a large quantity of data storage devices in various rack-mounted and high-density storage configurations.

Magnetic storage drives, such as hard disk drives, can employ various high-density magnetic storage technologies. One such storage technology includes data storage drives with shingled magnetic recording (SMR) technology to increase storage densities on associated storage media. SMR technology physically overlaps adjacent data tracks on a magnetic storage media to establish high-density storage on the storage media, in contrast to a non-overlapping recording technology, such as perpendicular magnetic recording (PMR) or other non-overlapping recording techniques.

However, data storage devices that employ high-density recording techniques can experience higher data failure rates during writes and reads due to the close spacing of adjacent tracks. Slowdowns in throughput can also occur due in part to lengthy write verification processes for the data after writing onto the storage media.

OVERVIEW

To provide enhanced operation of data storage devices and systems, various systems, apparatuses, methods, and software are provided herein. In a first example, a data storage device is presented that performs a write process to store data on a storage medium of the data storage device responsive to one or more write operations received over a host interface. The data storage device monitors a quality of the write process and determines when the quality of the write process falls below a threshold quality. Responsive to the quality of the write process falling below the threshold quality, the data storage device indicates the quality of the write process to a data protection node that determines data parity information for the data to compensate for the quality of the write process. The data storage device receives the data parity information and stores the data parity information.

In another example, a method of operating a data storage device is presented. The method includes performing a write process to store data on a storage medium of the data storage device responsive to one or more write operations received over a host interface, monitoring a quality of the write process and determine when the quality of the write process falls below a threshold quality. In response to the quality of the write process falling below the threshold quality, the method includes indicating the quality of the write process to a data protection node that determines data parity information for the data to compensate for the quality of the write process. The method also includes receiving the data parity information and responsively storing the data parity information.

In another example, a data storage system is presented. The data storage system includes a plurality of data storage devices each configured to store and retrieve data on associated storage media. A first data storage device is configured to perform a write process to store data on a storage medium of the first data storage device responsive to one or more write operations received over a host interface. The first data storage device is configured to monitor a quality of the write process and determine when the quality of the write process falls below a threshold quality. Responsive to the quality of the write process falling below the threshold quality, the first data storage device is configured to indicate the quality of the write process to a data protection node that determines data parity information for the data to compensate for the quality of the write process. The first data storage device is configured to receive the data parity information and store the data parity information on at least one of the first data storage device and the second data storage device.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

High-density magnetic storage devices employ a variety of storage technologies. One such storage technology includes rotating data storage drives with shingled magnetic recording (SMR) technology. SMR technology allows for read/write heads to physically overlap adjacent data tracks on the storage media, in contrast to a non-overlapping recording technology, such as perpendicular magnetic recording (PMR), among others. Since SMR technology has closely-spaced and overlapping data tracks on the storage media, sequential or burst write operations are preferred instead of random write operations. The tight spacing of the tracks can also lead to higher error rates for data written onto the media. This has led to the use of write-read-verify operations which write a burst of data which is then read from the media and verified as written properly. However, the write-read-verify operations can impact throughput of the data storage devices, and produce a slower than desired operation. Other storage media types, such as solid state media can also suffer from write-read-verify slowdowns, such as flash media, magnetoresistive media, or optical media, among others. Hybrid data storage devices, which use both rotating magnetic media and solid state media, can also be affected by write-read-verify slowdowns in both of the media types.

In the examples herein, write-read-verify can be reduced or avoided using enhanced data protection processes which consider a write quality when generating extra data protection information, such as parity or error correcting code (ECC) parity. In normal operation, a data storage device, such as a hard disk drive, generates a "hardware" parity for each track of data written to the media. However, the data of the track is still typically read back and verified before writing to another track. Although some examples perform track verification in batches, the write-read-verify process still occurs.

Figure 1:
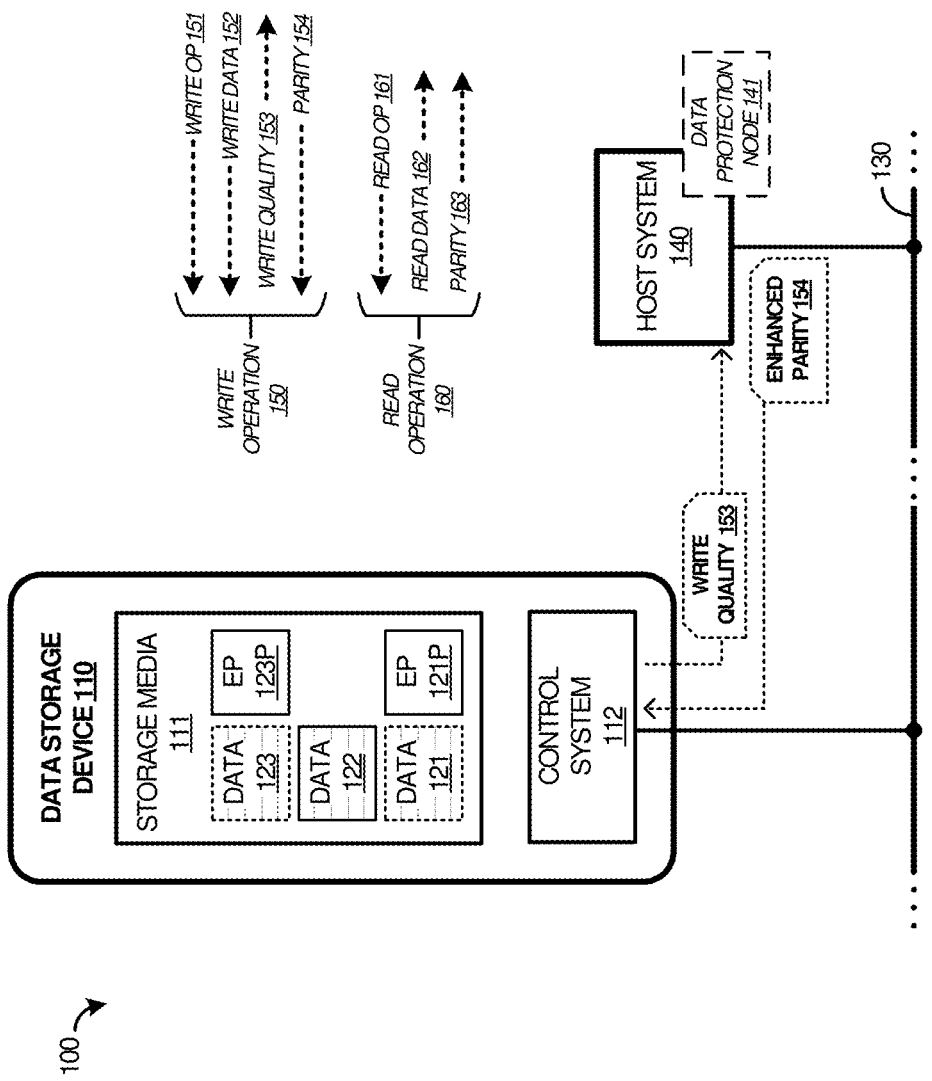
FIG. 1 is a system diagram illustrating a data system.

In a first example of an enhanced data storage system, FIG. 1 is presented. FIG. 1 is a system diagram illustrating data system 100. System 100 includes data storage device 110 and host system 140. Data storage device 110 and host system 140 communicate over storage link 130. Data storage device 110 can be included in an assembly that includes one or more data storage devices and one or more control systems. In FIG. 1, data storage device 110 includes control system 112 and storage media 111. Control system 112 is communicatively coupled to storage media 111. Although control system 112 is shown as internal to data storage device 110 in this example, it should be understood that in other examples control system 112 can be included in other elements external to data storage device 110. In some examples, data storage device 110 comprises a hard disk drive (HDD).

In operation, data storage device 110 receives read or write transactions over storage link 130 issued by host system 140. Responsive to read transactions, data storage device 110 can retrieve data stored upon storage media 111 for transfer to host system 140. Responsive to write transactions, data storage device 110 stores data on storage media 111. It should be understood that other components of data storage device 110 are omitted for clarity in FIG. 1, such as transaction queues, chassis, enclosures, fans, interconnect, read/write heads, armatures, preamps, transceivers, processors, amplifiers, motors, servos, enclosures, and other electrical and mechanical elements.

Data is stored responsive to various storage operations, such as write operations received by data storage array over storage link 130. Data storage device 110 receives storage operations transferred by host system 140 that comprise write operations for storage of write data on storage media 111 and read operations for retrieval of data already stored on storage media 111. In this example, the storage operations are received by control system 112 over storage link 130, and can be received into a transaction queue or input/output operations (IOs) queue for handling by control system 112.

Figure 2:
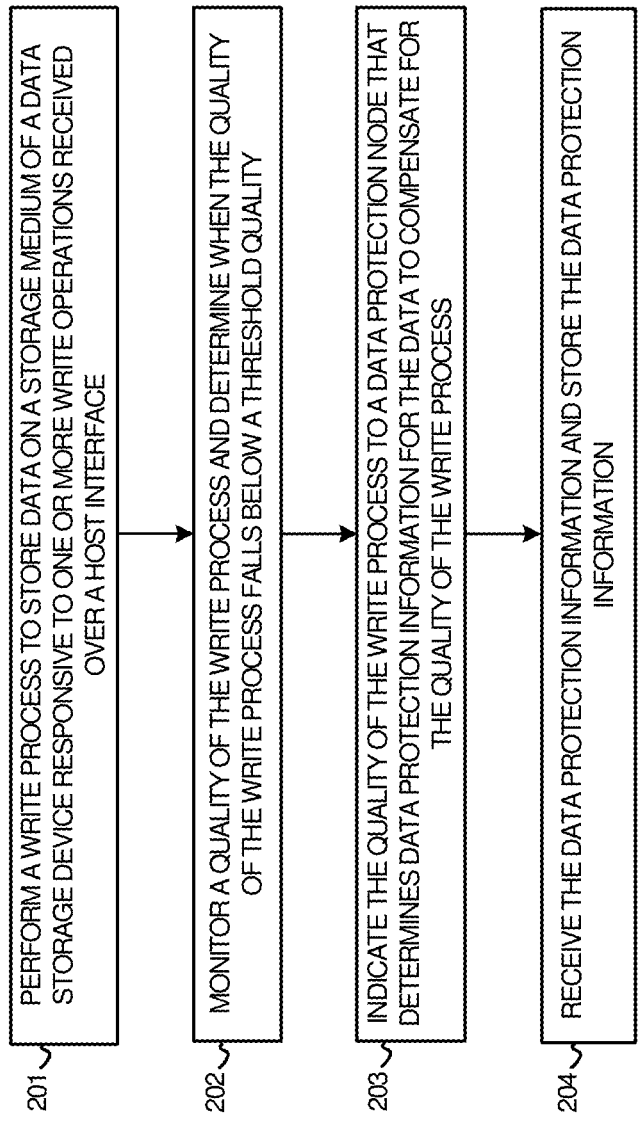
FIG. 2 is a flow diagram illustrating a method of operation of a data storage system.

To further illustrate the operation of data system 100, FIG. 2 is provided. FIG. 2 is a flow diagram illustrating a method of operating data storage device 110. The operations of FIG. 2 are referenced below parenthetically. In FIG. 2, control system 112 performs (201) a write process to store data on storage medium 111 of data storage device 110 responsive to one or more write operations received over a host interface.

In FIG. 1, data storage device 110 can include a host interface for communicating over link 130, and this host interface can be included in control system 112 or other elements of data storage device 110. The write process can comprise write operation 150 of FIG. 1, which can include one or more write commands or write ops 151 received from host system 140. This write process can command data storage device 110 to write a burst of data to storage media 111, where the burst of data can span one or more tracks of storage media 111. In a first write process, data 121 is written to media 111. In a second write process, data 122 is written to media 111. In a third write process, data 123 is written to media 111.

Typically, media 111 is subdivided into many sub-portions, such as sectors, which comprise a fixed size during initial formatting of the media, such as 4 kilobytes (KB) or 4096 bytes. These sectors can be arranged into concentric tracks on media 111, with each track comprising a predetermined number of sectors, such as 63 or 400 sectors per track. Each write process discussed in FIGS. 1 and 2 comprises one or more write ops 151 accompanied by write data, such as indicated by write data 152 in FIG. 1. The write data can comprise a storage block or write band of write data which spans more than one track of media 111, such as 2 megabytes (MB), 16 MB, 64 MB, 128 MB, or 256 MB of data, among other data block sizes, which can vary between write bands.

During the write process, control system 112 monitors (202) a quality of the write process and determines when the quality of the write process falls below a threshold quality. The quality of the write process can correspond to how well each track of data was written onto media 111. For example, when a read/write head on a moving armature is employed to write and read data onto media 111, the alignment and positioning of the read/write heads over the media can vary due vibrations, environmental conditions, and positioning accuracy of associated electromechanical components. When tracks are spaced tightly on media 111, such as in SMR examples, the positioning accuracy can vary from track to track and from moment to moment. Control system 112 can monitor the positioning accuracy to determine how accurate each track was written against an idealized position.

In some examples, the write quality is measured by detecting squeezed sectors during the write process based on at least position error signal (PES) metrics monitored during the write process. The PES metrics can indicate how accurately a target position is met by an actual position of a read/write head over the media during a write process. Track-to-track differences, or delta-PES metrics, can also be monitored to identify variability in the spacing between adjacent tracks. The quality of the write process can then be determined based at least on a quantity of squeezed sectors for each track.

Various thresholds can be established to gauge the quality of the write process. A first threshold can be established which indicates a threshold number of squeezed sectors per track. A different threshold can be established which corresponds to a distance between adjacent tracks, as measured by the PES metrics. Further thresholds can be established based on the accuracy of the write process with regards to the media. In another example threshold, the threshold is set to a predetermined quantity of squeezed sectors per track, such as 4. This predetermined quantity can be selected as being greater than a number of sectors protected by parity information employed in the track writing process. This predetermined quantity can be selected as being greater than a number of sectors used for parity information.

In non-rotating magnetic media, write quality can be gauged by other metrics. For example, write voltage accuracy in flash memory, where a target write voltage might vary from an actual voltage achieved during a write process which can affect the quality of the write process onto the media. Optical media, such as phase change media, can have optical intensity accuracy or optical frequency accuracy which can affect the quality of the write process onto the media. Various thresholds can be established which indicate when the write quality falls below a quality target, and can be indicated in a number of data blocks, bits, cells, or other delineations which might have a write quality below a desired value.

Control system 112 indicates (203) the quality of the write process to a data protection node that determines data protection information for the data to compensate for the quality of the write process. In FIG. 1, control system 112 indicates write quality 153 to host system 140 over link 130. In this example, host system 140 comprises data protection node 141. In other examples, data protection node 141 is included in separate systems than host system 140, or can be included in data storage device 110. Write quality 153 can indicate when the write quality monitored by control system 112 falls below the target or threshold write quality. Write quality 153 can indicate when the write quality monitored by control system 112 exceeds a threshold quantity of poor quality data portions, such as exceeding a threshold quantity of squeezed sectors.

Control system 112 receives (204) the data protection information and stores the data protection information. In FIG. 1, control system 112 receives enhanced parity information 154 over link 130 and stores enhanced parity information 154 onto storage media 111. When stored on media 111, enhanced parity information can be stored with the associated data block or in a separate location, such a location designated for storing enhanced parity information. Enhanced parity information can be stored onto storage media 111 or onto other storage media separate from storage media 111, where the separate storage media can be included in data storage device 110 or in another storage device. Redundancy techniques can be employed for enhanced parity information to ensure reliable storage of enhanced parity information 154.

In FIG. 1, enhanced parity information for data 121 is stored as enhanced parity 121P. In this example, data 122 was written with sufficient write quality and thus no enhanced parity is stored for data 122. Enhanced parity information for data 123 is stored as enhanced parity 123P. The enhanced parity information determined by data protection node 141 and transferred to data storage device 110 comprises data protection information for the entire write block or band stored in write process 150. For example, enhanced parity information 121P includes data protection information for the entire data block 121, which can comprise several MBs of data, as indicated above. The data protection information comprises data parity bytes or sectors of parity bytes used to detect and correct errors in data.

Although the term "parity" or "ECC parity" are used in the current examples, it should be understood that other data protection schemes can be employed for the enhanced data protection information, such as error correcting code (ECC) bytes, forward error correction (FEC) bytes, Reed-Solomon error correcting code information, low-density parity-check (LDPC) information, or other data protection information. The enhanced parity information comprises data protection information calculated in addition to any hardware parity performed by data storage device 110 during the write process to the storage media, such as per-track parity or ECC parity calculated in HDD writes.

Returning to the elements of FIG. 1, data storage device 110 includes one or more computer readable storage media 111 accessible via one or more read/write heads and associated electromechanical elements. Data storage device 110 also includes processing circuitry, communication interfaces, armatures, preamps, transceivers, processors, amplifiers, motors, servos, enclosures, and other electrical and mechanical elements. Data storage device 110 can also comprise cache systems, chassis, enclosures, fans, interconnect, cabling, or other circuitry and equipment.

Data storage device 110 can comprise a hard disk drive, hybrid disk drive, or other computer readable storage device. Data storage device 110 can include further elements, such as those discussed for hard disk drives 320 in FIG. 3, although variations are possible. The computer readable storage media of data storage device 110 can include rotating magnetic storage media, but can additionally include other media, such as solid state queues or cache systems of data storage device 110. These other media can include solid state storage media, optical storage media, non-rotating magnetic media, phase change magnetic media, spin-based storage media, or other storage media, including combinations, variations, and improvements thereof. In some examples, data storage device 110 comprises a hybrid hard drive employing solid state storage elements in addition to rotating magnetic storage media. Storage media 111 can employ various magnetic storage schemes, such as shingled magnetic recording (SMR), non-shingled magnetic recording, perpendicular magnetic recording (PMR), including combinations, variations, and improvements thereof.

Storage control system 112 includes processing circuitry, communication interfaces, and one or more non-transitory computer-readable storage devices. The processing circuitry can comprise one or more microprocessors and other circuitry that retrieves and executes firmware from memory for operating as discussed herein. The processing circuitry can be implemented within a single processing device but can also be distributed across multiple processing devices or sub-systems that cooperate in executing program instructions. Examples of the processing circuitry include general purpose central processing units, application specific processors, and logic devices, as well as any other type of processing device, combinations, or variations thereof. The communication interfaces can include one or more storage interfaces for communicating with host systems, networks, and the like. The communication systems can include transceivers, interface circuitry, connectors, buffers, microcontrollers, and other interface equipment.

Host system 140 can include processing elements, data transfer elements, and user interface elements. In some examples host system 140 is a central processing unit of a computing device or computing system. In other examples, host system 140 also includes memory elements, data storage and transfer elements, controller elements, logic elements, firmware, execution elements, and other processing system components. In yet other examples, host system 140 comprises a RAID controller processor or storage system central processor, such as a microprocessor, microcontroller, Field Programmable Gate Array (FPGA), or other processing and logic device, including combinations thereof. Host system 140 can include, or interface with, user interface elements which can allow a user of data storage system 100 to control the operations of data storage system 100 or to monitor the status or operations of data storage system 100. These user interface elements can include graphical or text displays, indicator lights, network interfaces, web interfaces, software interfaces, user input devices, or other user interface elements. Host system 140 can also include interface circuitry and elements for handling communications over storage link 130, such as logic, processing portions, buffers, transceivers, and the like.

In FIG. 1, host system 140 comprises data protection node 141. Data protection node 141 can comprise one or more hardware or software elements that comprise host system 140. For example, data protection node 141 can comprise a parity or ECC data generation module which can generate data protection information for blocks of data. This data protection information can be calculated using a discrete processing circuit, such as a co-processor, FPGA, or other circuitry. This data protection information can be calculated using a processing system of host system 340, such as central processing units (CPUs) executing various software which can include the data protection generation software along with associated operating system, user interface, and other software. Combinations of hardware/software can be employed to comprise data protection node 141.

Storage link 130 can include one or more serial or parallel data links, such as a Peripheral Component Interconnect Express (PCIe) interface, serial ATA interface, Serial Attached Small Computer System (SAS) interface, Integrated Drive Electronics (IDE) interface, ATA interface, Universal Serial Bus (USB) interface, wireless interface, Direct Media Interface (DMI), Ethernet interface, networking interface, or other communication and data interface, including combinations, variations, and improvements thereof. Although one bus 130 is shown in FIG. 1, it should be understood that one or more discrete links can be employed between the elements of data storage system 100.

Figure 3:
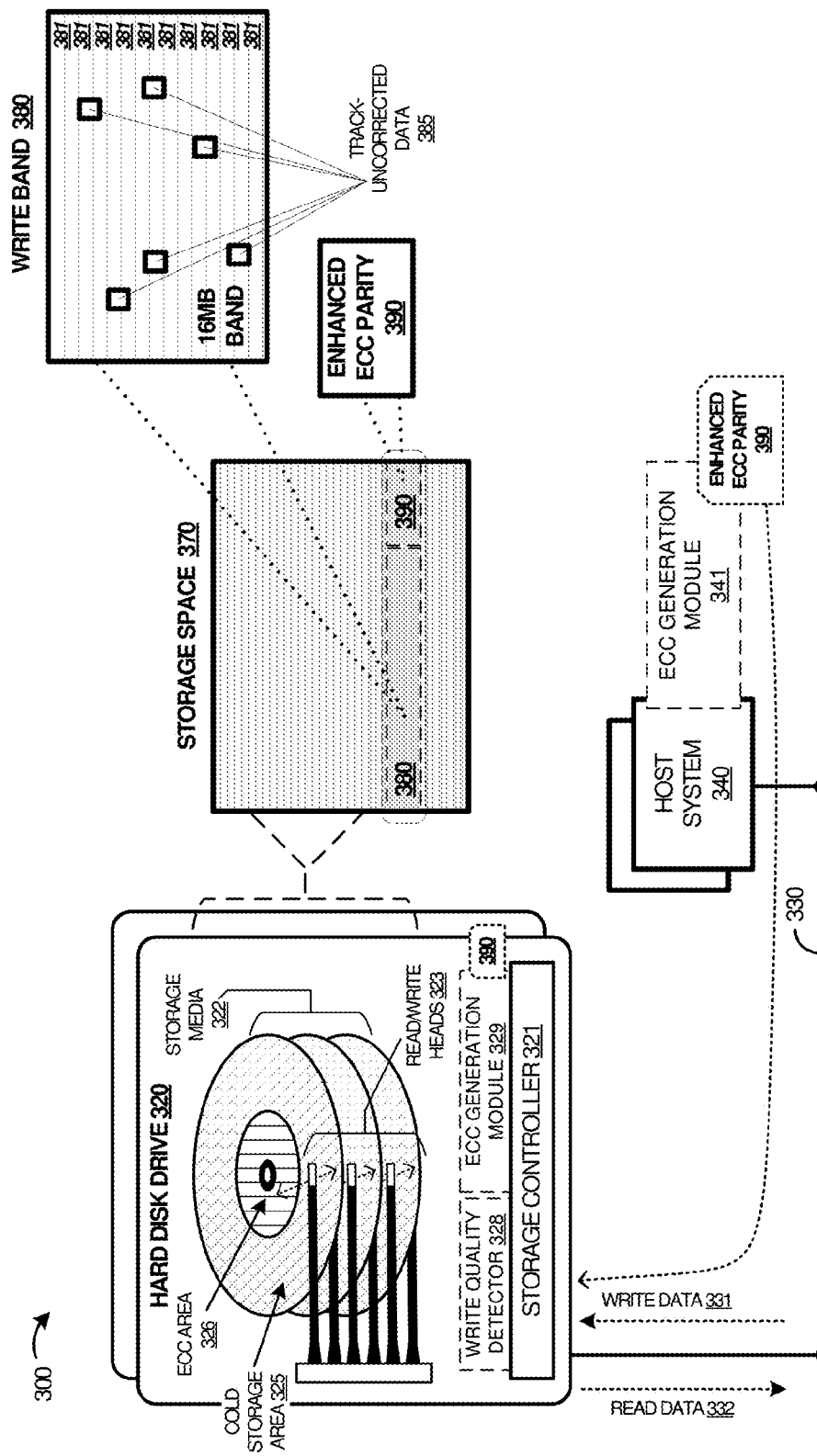
FIG. 3 is a system diagram illustrating a data system.

As a further example data storage system employing a data storage array, FIG. 3 is presented. FIG. 3 is a system diagram illustrating data storage system 300. Data storage system 300 includes one or more hard disk drives (HDDs), such as HDD 320, and also includes one or more host systems 340. HDD 320 and host system 340 communicate over storage link 330. Various elements of HDD 320 can be included in data storage device 110 of FIG. 1, although variations are possible. Although one HDD is focused on in FIG. 3, it should be understood that more than one HDD could be included and linked to host system 340 or other host systems, such as in a data storage environment employing many hard disk drives in an array.

HDD 320 comprises a hard disk drive, hybrid disk drive, or other computer readable storage device. HDD 320 includes storage controller 321, includes storage media 322, R/W heads 323. Storage controller 321 includes one or more sub-modules which include write quality detector 328 and ECC generation module 329. HDD 320 can include further elements, such as armatures, preamps, transceivers, processors, amplifiers, motors, servos, enclosures, and other electrical and mechanical elements. In FIG. 3, HDD 320 also subdivides storage media 322 into at least two zones, namely cold storage area 325 and ECC area 326. In further examples, separate zones are not employed and a shared storage zone is used.

Storage controller 321 handles storage operations for HDD 320, such as receiving storage operations from host systems over storage link 330. Write data 331 can be received in one or more write operations, and read data 332 can be provided to hosts responsive to one or more read operations. Storage controller 321 or host system 340 can establish any number of logical volumes or logical storage units for HDD 320 or among other HDDs, which can comprise spanning, redundant arrays, striping, or other data storage techniques.

Write quality detector 328 and ECC generation module 329 can each comprise one or more hardware or software elements that are included in HDD 320. In some examples, write quality detector 328 and ECC generation module 329 are included in elements of storage controller 321. For example, ECC generation module 329 can comprise a parity or ECC data generation module which can generate data protection information for blocks of data, and can comprise similar elements as ECC generation module 341 of host system 340. Write quality detector 328 can comprise a storage media monitoring module which monitors performance during writes to an associated storage medium, such as media 322 of HDD 320. During write operations to media 322, write quality detector 328 monitors write quality and determines PES data or squeezed sector data for writes to each track of storage media 322. Write quality detector 328 and ECC generation module 329 can each employ discrete processing circuitry, such as a co-processor, FPGA, or other circuitry, which can include a processing system of HDD 320, such as a CPUs executing various software which can include write quality detection and ECC generation software along with associated storage controllers, operating systems, user interfaces, and other software. Combinations of hardware/software can be employed to comprise each of write quality detector 328 and ECC generation module 329.

HDD 320 can be included in a redundant array of independent disks (RAID) array, a JBOD device ("Just a Bunch Of Disks"), or a virtual box of disks (VBOD) device which include a plurality of independent disks which can be spanned and presented as one or more logical drives to host system 340. A VBOD device employs one or more SMR hard disk drives in an array. However, SMR disks typically have inefficiencies for random writes due to the shingled nature of adjacent tracks for data. The VBOD abstracts the SMR drives and allows random writes and random reads while still having underlying SMR media which ultimately hold the associated data.

Storage link 330 can include one or more links, although a single link is shown in FIG. 3. Storage link 330 can comprise a storage or disk interface, such as Serial Attached ATA (SATA), Serial Attached SCSI (SAS), FibreChannel, Universal Serial Bus (USB), SCSI, InfiniBand, Peripheral Component Interconnect Express (PCIe), Ethernet, Internet Protocol (IP), or other parallel or serial storage or peripheral interfaces, including variations and combinations thereof.

Host system 340 can include one or more computing and network systems, such as personal computers, servers, cloud storage systems, packet networks, management systems, or other computer and network systems, including combinations and variations thereof. In operation, host system 340 issues read and write commands or operations to HDD 320 over storage link 330, among other commands or operations which can include control instructions, metadata retrieval operations, configuration instructions, and the like. Likewise, HDD 320 can transfer read data over storage link 330, among other information such as graphical user interface information, status information, operational information, failure notifications, alerts, and the like.

ECC generation module 341 can comprise one or more hardware or software elements that are included in host system 340. For example, ECC generation module 341 can comprise an ECC parity or ECC data generation module which can generate data protection information for blocks of data. This data protection information can be calculated using a discrete processing circuit, such as a co-processor, FPGA, or other circuitry. This data protection information can be calculated using a processing system of host system 340, such as a CPUs executing various software which can include the data protection generation software along with associated operating system, user interface, and other software. Combinations of hardware/software can be employed to comprise ECC generation module 341.

Figure 4:
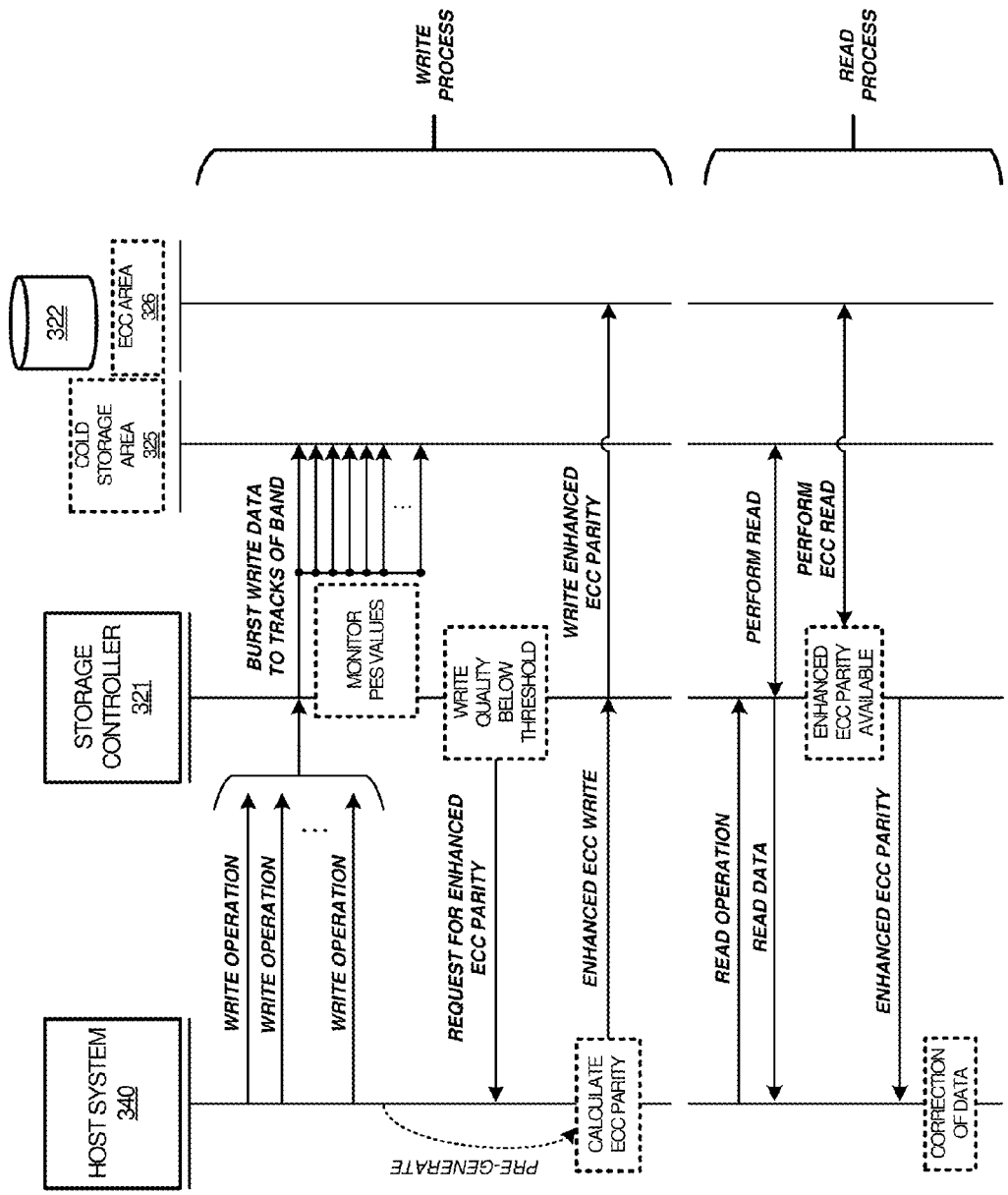
FIG. 4 is a flow diagram illustrating a method of operation of a data storage system.

To further illustrate the operation of system 300 and HDD 320, FIG. 4 is presented. FIG. 4 is a sequence diagram illustrating a method of operation of system 300. In FIG. 4, host system 340 initiates a write process to write a band of data to HDD 320. This band of data comprises a 16 MB block of data, which spans multiple tracks of media 322 of HDD 320. Host system 340 issues one or more write operations to transfer the write data to HDD 320 for writing to media 322. In FIG. 3, write data 331 can represent one or more portions of the write band transferred by host system 340 over link 330 for delivery to HDD 320.

Storage controller 321 of HDD 320 receives the write operations and associated write data and performs a burst write of data to cold storage area 325 of media 322. Cold storage area 325 comprises an SMR region of media 322 which includes tightly spaced or overlapping tracks of data on media 322. Due to the tight spacing, write bursts are preferred to ensure existing data does not get overwritten which would occur if random writes were instead employed.

Storage controller 321 can stage the write operations and write data in a queue or other data structure prior to committing to media 322, such as an I/O queue, command queue, or other temporary storage. This temporary storage can be incorporated into a host interface portion of HDD 320, and this host interface can be included in portions of storage controller 321 or other elements of HDD 320.

During the write process to write data onto media 322, storage controller 321 monitors write quality for the data being written onto media 322. The write quality can comprise monitoring position error signal (PES) metrics during the write process. The PES metrics can indicate how accurately a target position is met by an actual position of a read/write head over media 322 during the write process. Track-to-track differences, or delta-PES metrics, can also be monitored to identify variability in the spacing between adjacent tracks.

Figure 5:
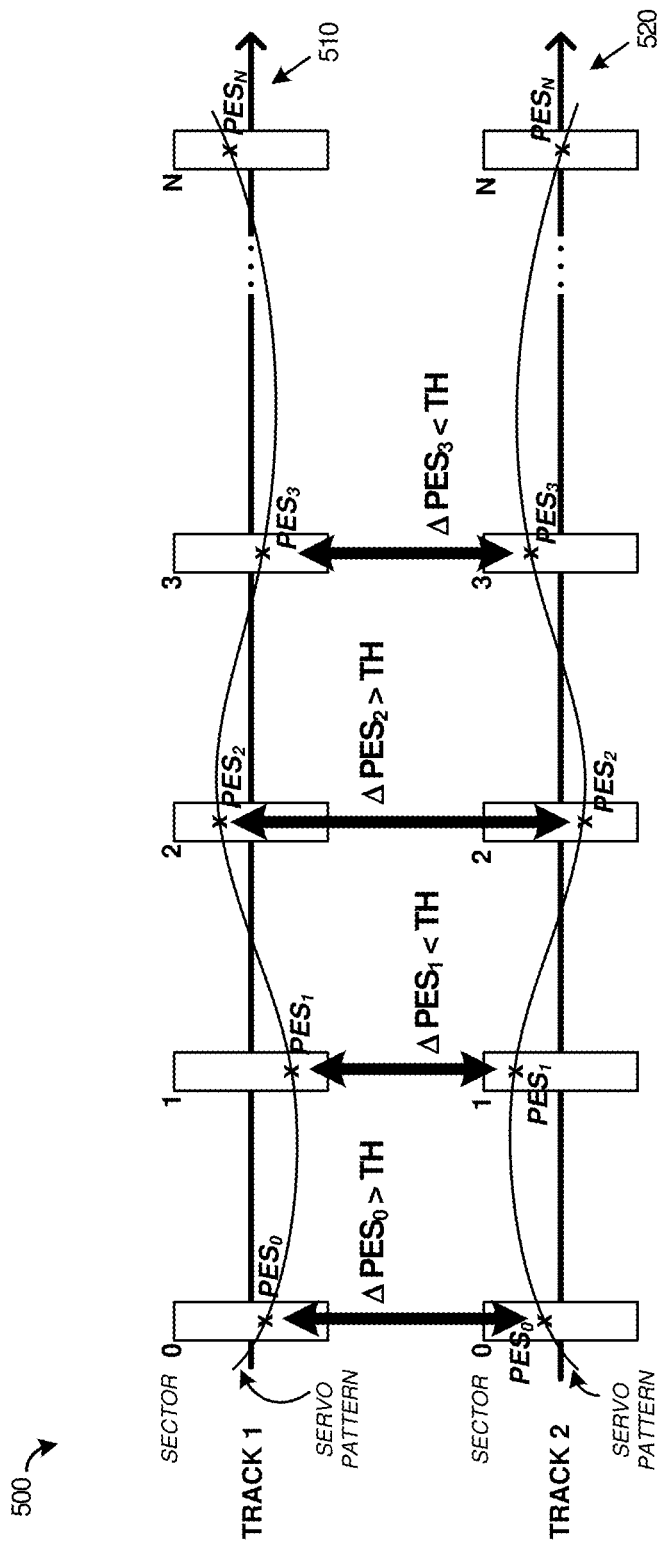
FIG. 5 is a diagram illustrating position error signal detection.

As one example of PES monitoring during writes, FIG. 5 is presented. FIG. 5 includes a representation of two adjacent tracks of a storage medium, such as media 322, although other media can be represented. The tracks are concentric circles in examples of rotating magnetic media, and FIG. 5 shows each track expanded to a linear illustration. Each sector written to the associated track is indicated by a number above from 0 to 'N' which represents all of the sectors of the associated track.

As data is written for a particular track, such as track 1, a servo pattern occurs due to movement of the read/write heads 323 over the media due to actuation of armatures and associated servo or voicecoil components which position read/write heads 323 over the media. This process has inherent errors and imprecisions which can lead to variations in the tracking of the read/write head over the associated media, as shown by a meandering line representing the servo pattern in FIG. 5. A similar process occurs for track 1 and track 2 in FIG. 5, with specific servo patterns associated therewith. The motion of the read/write heads can be monitored by storage controller 321, or other monitoring components (including write quality detector 328 of FIG. 3). This movement can be compared to an idealized circular pattern and deviations from this can be monitored for each track.

Track-to-track comparisons of the servo patterns can be compared for sectors which lie adjacent to each other on the adjacent tracks. This track-to-track comparison can be referred to as a delta-PES measurement. For example, sector 0 of track 1 can be compared to sector 0 of track 2, and so on for the remaining sectors of each track. The delta-PES would indicate how tightly packed adjacent tracks are by monitoring the individual sectors of each adjacent track. Variations in positioning of the read/write heads during the write process can lead to "squeezing" of a particular sector, which can lead to data corruption. A delta-PES threshold can be established that indicates when particular sectors are squeezed too tightly together, which is an indicator of write quality. The threshold can be established as a center-to-center measurement for sectors of adjacent tracks or can instead be established as a percentage of ideal track-to-track width which is achieved during a write process, such as 80% or 90% of ideal track width, among other thresholds.

Thus, a running count can be maintained for each track to monitor which sectors have delta-PES measurements less than a delta-PES threshold. In FIG. 5, sector 0 and 2 have delta-PES measurements greater than the threshold level, and thus are not squeezed. Conversely, sector 1 and 3 have delta-PES measurements less than the threshold level, and thus are considered squeezed. The quality of the write process can then be determined based at least on a quantity of squeezed sectors for each track.

Figure 6:
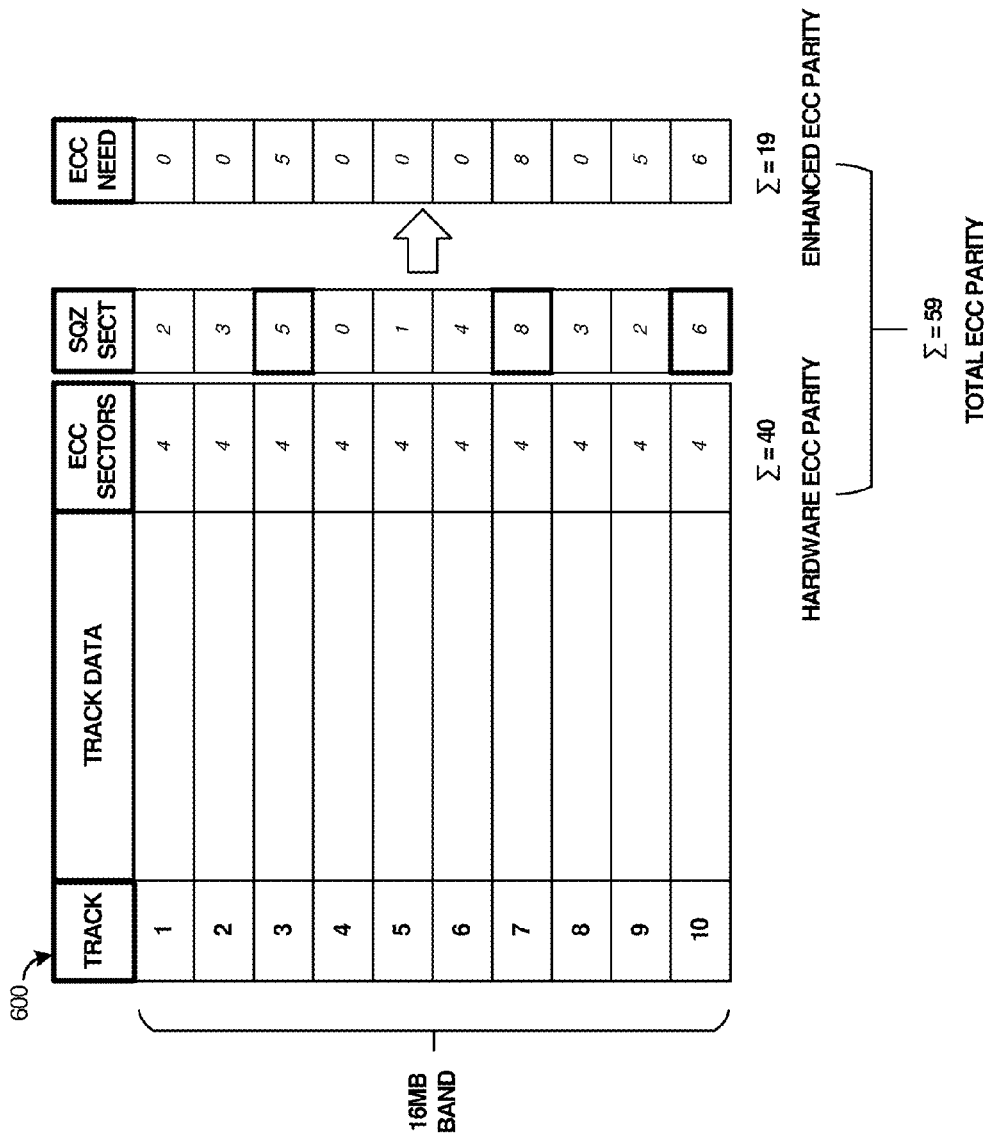
FIG. 6 is a diagram illustrating example ECC parity quantity calculations.

FIG. 6 shows table 600 as an illustration of several tracks that comprise a storage block or write band of 16 MB. Although 10 tracks are shown in FIG. 6, it should be understood that other quantities of tracks are possible, and vary based on the quantity of data written. Data protection information, such as ECC parity, is included with the write data on the storage media for each track written. Storage controller 321 handles this ECC parity generation and inclusion, and the quantity of ECC parity included is typically predetermined as a fixed quantity. In this example, a fixed quantity of four (4) ECC parity sectors are employed for each track. However, this quantity may not be sufficient in all cases to protect the data written to allow for error detection and/or error correction due to squeezed sectors and other data corruption.

Various further thresholds can be established to gauge the quality of the write process which can be used to determine when further data protection is desired. A quality threshold can be established which indicates a threshold number of squeezed sectors per track. Further thresholds can be established based on the accuracy of the write process with regards to the media. In an example quality threshold, the threshold is set to a predetermined quantity of squeezed sectors per track, such as 4. This predetermined quantity can be selected as being greater than a number of sectors protected by ECC parity information employed in the track writing process. This predetermined quantity can be selected as being greater than a number of sectors used for ECC parity information.

FIG. 6 illustrates a quantity of squeezed sectors per track based on a delta-PES measurement for each track, with some of the tracks having a greater number of squeezed sectors than others. For the ones of the tracks with a quantity of squeezed sectors above a threshold quantity, then further enhanced ECC parity can be determined. For example, if the threshold quantity of squeezed sectors is '4' then tracks 3, 7, and 10 each have squeezed sector counts in excess of the threshold. The final column in table 600 indicates a quantity of extra ECC sectors desired, which in this example is equal to the number of squeezed sectors for the tracks which exceed the threshold quantity of squeezed sectors. Below table 600 is a short calculation of the total number of data protection sectors. Specifically, 40 'hardware' ECC parity sectors are employed for the normal track ECC parity process. An additional 19 enhanced ECC parity sectors are desired which sums to a total of 59 total ECC parity sectors that offer data protection for the 16 MB data band written to storage media 322 of FIG. 3.

Turning back to the operation of FIG. 4, storage controller 321 indicates a quantity of additional ECC parity sectors desired for the particular write band when the quality of the write indicates additional ECC parity sectors are needed beyond the hardware ECC parity provided for each track. HDD 320 will thus issue a request for enhanced ECC parity from an ECC generation module.

In FIG. 3, two possible ECC parity generation modules are indicated, although others can instead be included. The first example ECC parity generation module is included in HDD 320, as noted by ECC generation module 329. The second example ECC parity generation module is included in host system 340, as noted by ECC generation module 341. The ECC parity generation module can include one or more processing modules which calculates ECC parity based on the write data of the write band.

Although HDD 320 can calculate the ECC parity in some examples, host system 340 typically includes more robust processing resources, memory, and calculation throughput capabilities than HDD 320. Thus, in many examples HDD 320 will request the additional ECC parity from host system 340. Host system 340 typically maintains a copy of the write data of the write band for use in calculation of the ECC parity based on the entirety of the write data of the write band. The ECC parity calculated can comprise ECC parity for the entire 16 MB band of data and can be calculated similarly to the hardware ECC employed for each track of data by HDD 320. At least a portion of the ECC parity can be calculated by host system 340 prior to actual transfer of associated write data of the write band to HDD 320, and any unrequested or unused ECC parity can be discarded by host system 340. Thus, the ECC parity can be pre-generated by host system 340 and held until requested by HDD 320 responsive to write quality. Alternatively, the ECC parity can be generated upon request of HDD 320.

Host system 340 then transfers enhanced ECC parity 390 for delivery to HDD 320 (or alternatively, ECC generation module 329 calculates enhanced ECC parity 390 in HDD 320). Host system 340 transfers enhanced ECC parity 390 over link 330 using one or more specialized storage commands or storage operations tailored to indicate the data being transferred is enhanced ECC parity 390 and not ordinary write data. This specialized command can comprise a parity or ECC write command with an opcode or header which indicates enhanced ECC parity 390. This specialized command can comprise a normal write command with a storage address which indicates an associated payload is enhanced ECC parity 390, such as by encoding a non-usable address as an indicator of enhanced ECC parity 390. Other indications or commands can be issued by host system 340 to indicate and transfer enhanced ECC parity 390.

Storage controller 321 receives enhanced ECC parity 390 and stores the data protection information. In a first example, storage controller 321 writes this enhanced ECC parity 390 to storage media 322. FIG. 3 includes an example storage format for storing the write band and associated ECC parity.

In FIG. 3, storage space 370 comprises a logical volume of HDD 320, which can comprise the entire storage space of HDD 320, or a portion thereof. Within storage space 370, write band 380 is stored and comprises several tracks of media 322, such as 10 tracks shown in FIG. 6. Each track has an associated hardware ECC, noted by element 381, with 10 hardware ECC portions included in write band 380. This hardware ECC is calculated based on the data of each track individually, and thus each hardware ECC will offer data protection for only a corresponding track. The quantity of ECC will typically be predetermined as mentioned above, and can be measured in a number of ECC sectors, such as 4 per track in FIG. 6.

In this first example, storage controller 321 stores enhanced ECC parity 390 adjacent to write band 380 on media 322. Enhanced ECC parity 390 can comprise a quantity of sectors-worth of ECC parity according to the quality of the write process for write band 380. Various examples are indicated herein for the quantity of enhanced ECC sectors, such as found in FIG. 6. Enhanced ECC parity 390 is calculated based on the data of the entire write band 380, and thus offers data protection for several tracks in bulk, such as for the entire 16 MB write band in FIG. 3.

In further examples, the write process for enhanced ECC parity 390 is monitored for write quality, as done for the write process of the write band. Any additional ECC parity can be further generated/stored when the write process for enhanced ECC parity 390 falls below the threshold write quality. This additional ECC parity can be stored along with enhanced ECC parity 390 or in alternative locations, as discussed herein.

Enhanced ECC parity 390 can be tracked by storage controller 321 as being associated with or otherwise correlated to the write data of write band 380. Specialized data structures can be maintained by storage controller 321 which track enhanced ECC parity and establish correspondences between enhanced ECC parity and associated data on media 322. For example, data storage locations, such as logical block addresses or physical block addresses can be listed in a data structure or table along with address information that locates enhanced ECC parity that was generated for the data stored in those logical or physical block addresses. In other examples, a header is employed for enhanced ECC parity stored on media 322, and a scan of media 322 can reveal the header information which indicates which write band the enhanced ECC parity is associated with. Other correlations or techniques can be employed to ensure correlations between enhanced ECC parity and associated data are properly maintained.

In further examples, enhanced ECC parity 390 is not stored with write band 380, and is instead stored in a specialized location on media 322, such as indicated by ECC area 326 in FIGS. 3 and 4. ECC area 326 might comprise a non-shingled portion of media 322 to provide additional data robustness for the ECC parity. This non-shingled portion can include a PMR portion or non-overlapping version of SMR, among other media recording types.

In yet further examples, enhanced ECC parity 390 is not stored on media 322. Enhanced ECC parity 390 can instead be stored in a separate storage medium of HDD 320, such as a flash storage medium or optical storage medium. Enhanced ECC parity 390 can instead be stored in a separate data storage device, such as another HDD or another data storage drive separate from HDD 320. In arrayed storage system, enhanced ECC parity 390 can be mirrored, striped, or employed in other data redundancy schemes to increase reliability or availability of enhanced ECC parity 390. In examples where enhanced ECC parity 390 is stored on a device separate from HDD 320, HDD 320 can transfer enhanced ECC parity 390 to the other devices, or host system 340 can instead transfer enhanced ECC parity 390 to those other devices instead of HDD 320.

Once the enhanced ECC parity is written, then the write process is complete for that particular write band. It should be noted that enhanced ECC parity might not be employed for each band, and can only be employed when the write quality for that band indicates that additional ECC protection is desired, as noted above. Furthermore, individual write verifications for each track of the write band can be omitted or skipped. This advantageously can lead to higher throughputs for HDD 320 and enhanced data protection using the enhanced ECC parity for the write band. Data integrity can be ensured while maintaining a high write throughput for HDD 320 when write verification is omitted after every track and after the entire write band. Write verification can be skipped in these examples due in part to the in situ monitoring of write quality. The write quality, such indicated by as delta-PES measurements or squeezed sector counts, can indicate when potential write quality is below a desirable threshold which can lead to data corruption. If the write quality falls below desirable thresholds, then additional enhanced ECC parity can be included for the write band to ensure data integrity is maintained even without accompanying write verification, such as write-read-verify processes.

During a read process, such as that indicated in FIG. 4, one or more read operations or read commands can be issued by host system 340 over link 330. The read operations can be issued for the entire write band 380, or for a portion thereof. When the read operations are for the entire write band 380, then enhanced ECC parity 390 can be employed to correct for errors in the read data. When a portion of write band 380 is read instead, then ECC parity associated with the individual tracks can be used. Storage controller 321 can receive the read operations and responsively retrieve data from storage media 322. When the read operations are issued for storage locations which are protected or associated with enhanced ECC parity, such as for write band 380, then storage controller 321 can both retrieve the data requested by the read operations and also retrieve the enhanced ECC parity.

In some cases, such as when squeezed sectors are encountered during the associated write process, various ones of the sectors read responsive to the read operations can be unprotected or uncorrected by any associated hardware or track ECC or parity. In FIG. 3, six (6) uncorrected sectors are illustrated which correspond to track ECC uncorrected data 385. In examples where enhanced ECC parity was not employed, then data 385 might encounter data corruption or have previously required a verify operation followed by an associated re-write to ensure the data was properly written to the storage media. However, in this example, enhanced ECC parity 390 was employed which can detect and correct any errors or corruption in data 385 due to the associated write process, such as due to squeezed sectors or other data corruption issues. Thus, enhanced ECC parity 390 can be transferred with the associate data requested by the read operations and enhanced ECC parity 390 can be used to correct any data errors.

In some examples, such as shown in FIG. 4, enhanced ECC parity 390 is transferred to host system 340 and host system 340 can perform a data error detection and correction process using enhanced ECC parity 390 and the associated data read from media 322. In other examples, HDD 320 can instead perform a data error detection and correction process using enhanced ECC parity 390 and the associated data read from media 322. When enhanced ECC parity is not employed for a particular write band, such as when detected write quality is above a threshold quality, then enhanced ECC parity might not be transferred to host system 340 or otherwise employed to check/correct for data errors.

Figure 7:
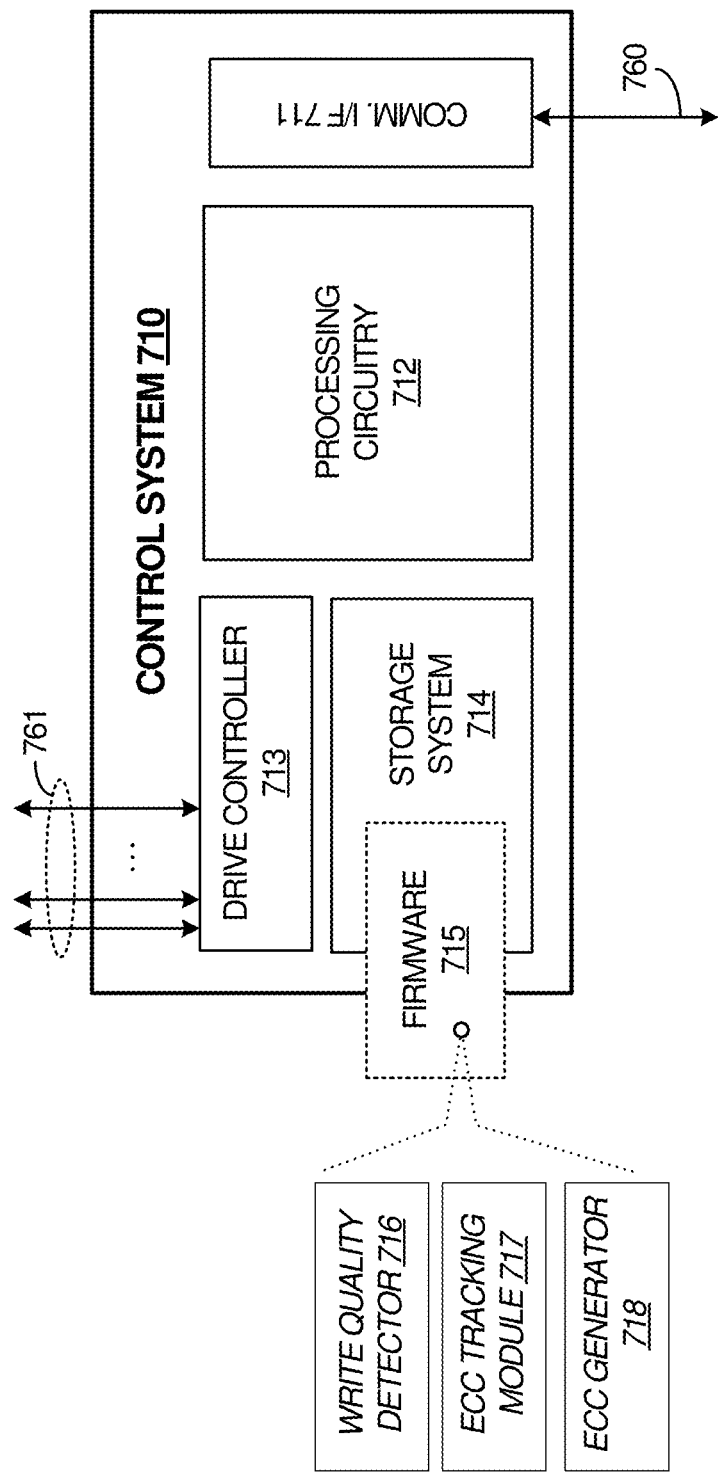
FIG. 7 is a block diagram illustrating a control system.

FIG. 7 is a block diagram illustrating control system 710. Control system 710 handles storage operations for a storage assembly. Control system 710 can be an example of control system 112 of FIG. 1, storage controller 321 of FIG. 3, or included in elements of host system 340 of FIG. 3, although variations are possible. When control system 710 is included in a data storage drive, control system 710 receives storage operations from host systems over storage link 760 by host interface 711. Write data can be received in one or more write operations, and read data can be provided to hosts responsive to one or more read operations.

Control system 710 includes host interface (I/F) 711, processing circuitry 712, drive controller 713, and storage system 714. Furthermore, control system 710 includes firmware 715 which includes write quality detector 716, ECC tracking module 717, and ECC generator 718 which, when executed by at least processing circuitry 712, operates as described below.

Host interface 711 includes one or more storage interfaces for communicating with host systems, networks, and the like over at least link 760. Host interface 711 can comprise transceivers, interface circuitry, connectors, buffers, microcontrollers, and other interface equipment. Host interface 711 can also include one or more I/O queues which receive storage operations over link 760 and buffers these storage operations for handling by processing circuitry 712. Link 760 can include one or more Ethernet interfaces, SATA interfaces, SAS interfaces, FibreChannel interfaces, USB interfaces, SCSI interfaces, InfiniBand interfaces, NVMe interfaces, or IP interfaces, which allows for the host system to access the storage capacity of HDD assembly.

Processing circuitry 712 can comprise one or more microprocessors and other circuitry that retrieves and executes firmware 715 from storage system 714. Processing circuitry 712 can be implemented within a single processing device but can also be distributed across multiple processing devices or sub-systems that cooperate in executing program instructions. Examples of processing circuitry 712 include general purpose central processing units, application specific processors, and logic devices, as well as any other type of processing device, combinations, or variations thereof. In some examples, processing circuitry 712 includes a system-on-a-chip device or microprocessor device, such as an Intel Atom processor, MIPS microprocessor, and the like.

Drive controller 713 can include one or more drive control circuits and processors which can control various data media handling among the various storage media of a storage device. Drive controller 713 also includes storage interfaces 761, to couple to the various data storage media. In some examples, drive controller 713 handles management of a particular recording technology, such as flash, optical, SMR, PMR, or other recording technology. As mentioned herein, elements and functions of drive controller 713 can be integrated with processing circuity 313.

Storage system 714 can comprise any non-transitory computer readable storage media readable by processing circuitry 712 or drive controller 713 and capable of storing firmware 715. Storage system 714 can include volatile and nonvolatile, removable and non-removable media implemented in any method or technology for storage of information, such as computer readable instructions, data structures, program modules, or other data. In addition to storage media, in some implementations storage system 714 can also include communication media over which firmware 715 can be communicated. Storage system 714 can be implemented as a single storage device but can also be implemented across multiple storage devices or sub-systems co-located or distributed relative to each other. Storage system 714 can comprise additional elements, such as a controller, capable of communicating with processing circuitry 712. Examples of storage media of storage system 714 include random access memory, read only memory, magnetic disks, optical disks, flash memory, SSDs, phase change memory, magnetic cassettes, magnetic tape, magnetic disk storage or other magnetic storage devices, or any other medium which can be used to store the desired information and that can be accessed by an instruction execution system, as well as any combination or variation thereof, or any other type of storage media.

Firmware 715 can be implemented in program instructions and among other functions can, when executed by control system 710 in general or processing circuitry 712 in particular, direct control system 710 or processing circuitry 712 to operate data storage systems as described herein. Firmware 715 can include additional processes, programs, or components, such as operating system software, database software, or application software. Firmware 715 can also comprise software or some other form of machine-readable processing instructions executable by processing circuitry 712.

In at least one implementation, the program instructions can include first program instructions that direct control system 710 to handle read and write operations, detect write quality during write operations or write processes (write quality detector 716), identify a number of potential error-prone sectors based on a delta-PES measurement of squeezed sectors (write quality detector 716), and report a write quality to an ECC generation module, such as a host system or to ECC generator 718. Once the enhanced ECC parity is generated or otherwise received, then ECC tracking module 717 can track where the enhanced ECC parity is written or stored, such as on a storage media along with the associated write data, another specialized location on the storage media, or on a separate storage device. During read operations, ECC tracking module 717 can identify when enhanced ECC parity is stored for associated data requested by the read operation, and instruct control system 710 to retrieve the enhanced ECC parity for delivery to a module or system which can check/correct data of a write band for errors.

In general, firmware 715 can, when loaded into processing circuitry 712 and executed, transform processing circuitry 712 overall from a general-purpose computing system into a special-purpose computing system customized to operate as described herein. Encoding firmware 715 on storage system 714 can transform the physical structure of storage system 714. The specific transformation of the physical structure can depend on various factors in different implementations of this description. Examples of such factors can include, but are not limited to the technology used to implement the storage media of storage system 714 and whether the computer-storage media are characterized as primary or secondary storage. For example, if the computer-storage media are implemented as semiconductor-based memory, firmware 715 can transform the physical state of the semiconductor memory when the program is encoded therein. For example, firmware 715 can transform the state of transistors, capacitors, or other discrete circuit elements constituting the semiconductor memory. A similar transformation can occur with respect to magnetic or optical media. Other transformations of physical media are possible without departing from the scope of the present description, with the foregoing examples provided only to facilitate this discussion.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above can be combined in various ways to form multiple embodiments. As a result, the invention is not limited to the specific embodiments described above, but only by the claims and their equivalents.

What is claimed is:

1. A data storage device, comprising:
   a storage control system configured to:
   perform a write process to store data on a storage medium of the data storage device responsive to one or more write operations received from a host system over a host interface;
   monitor a quality of the write process and determine when the quality of the write process falls below a threshold quality;
   responsive to the quality of the write process falling below the threshold quality, indicate the quality of the write process to a data protection node of the host system that determines data parity information for the data to compensate for the quality of the write process;
   receive a parity write command issued by the host system comprising the data parity information; and
   responsively store the data parity information.

2. The data storage device of claim 1, wherein the storage control system is further configured to:
   detect squeezed sectors during the write process based on at least position error signal (PES) metrics monitored during the write process; and
   determine the quality of the write process based at least on a quantity of squeezed sectors.

3. The data storage device of claim 2, wherein the threshold quality comprises a quantity of parity sectors employed during the write process, and wherein the storage control system is further configured to:
   when the quantity of squeezed sectors is greater than a threshold quantity of parity sectors employed during the write process, indicate the quality of the write process to the data protection node.

4. The data storage device of claim 1, wherein the storage control system is further configured to:
   skip write verification for the data after storage on the storage medium.

5. The data storage device of claim 1, wherein the storage control system is further configured to:
   store the data parity information on the storage medium; and
   track the data parity information as being associated with the data.

6. The data storage device of claim 5, wherein the storage control system is further configured to:
   store the data parity information on the storage medium in a different storage location than the data.

7. The data storage device of claim 1, wherein the storage control system is further configured to:
receive a read operation over the host interface for at least a portion of the data; and
in response, retrieve at least the portion of the data and the data parity information from the storage medium, and transfer the data and the data parity information over the host interface.

8. The data storage device of claim 1, wherein the write process to store the data comprises a burst write of a data band that spans a plurality of adjacent tracks of the storage medium, and wherein the data parity information comprises parity information for the data band.

9. A method of operating a data storage device, the method comprising:
performing a write process to store data on a storage medium of the data storage device responsive to one or more write operations received from a host system over a host interface;
monitoring a quality of the write process;
determining when the quality of the write process falls below a threshold quality;
in response to the quality of the write process falling below the threshold quality, indicating the quality of the write process to a data protection node of the host system that determines data parity information for the data to compensate for the quality of the write process;
receiving a parity write command issued by the host system comprising the data parity information; and
responsively storing the data parity information.

10. The method of claim 9, further comprising:
detecting squeezed sectors during the write process based on at least position error signal (PES) metrics monitored during the write process; and
determining the quality of the write process based at least on a quantity of squeezed sectors.

11. The method of claim 10, wherein the threshold quality comprises a quantity of parity sectors employed during the write process, and further comprising:
when the quantity of squeezed sectors is greater than a threshold quantity of parity sectors employed during the write process, indicating the quality of the write process to the data protection node.

12. The method of claim 9, further comprising:
skipping write verification for the data after storage on the storage medium.

13. The method of claim 9, further comprising:
storing the data parity information on the storage medium; and
tracking the data parity information as being associated with the data.

14. The method of claim 13, further comprising:
storing the data parity information on the storage medium in a different storage location than the data.

15. The method of claim 9, further comprising:
receiving a read operation over the host interface for at least a portion of the data; and
in response, retrieving at least the portion of the data and the data parity information from the storage medium, and transferring the data and the data parity information over the host interface.

16. The method of claim 9, wherein the write process to store the data comprises a burst write of a data band that spans a plurality of adjacent tracks of the storage medium, and wherein the data parity information comprises parity information for the data band.

17. A data storage system, comprising:
a plurality of data storage devices each configured to store and retrieve data on associated storage media; and
a first data storage device configured to:
perform a write process to store data on a storage medium of the first data storage device responsive to one or more write operations received from a host system over a host interface;
monitor a quality of the write process and determine when the quality of the write process falls below a threshold quality;
responsive to the quality of the write process falling below the threshold quality, indicate the quality of the write process to a data protection node of the host system that determines data parity information for the data to compensate for the quality of the write process;
receive a parity write command issued by the host system comprising the data parity information; and
responsively store the data parity information on at least one of the first data storage device and a second data storage device.

18. The data storage system of claim 17, wherein the threshold quality comprises a quantity of parity sectors employed during the write process, and wherein the first data storage device is further configured to:
detect squeezed sectors during the write process based on at least position error signal (PES) metrics monitored during the write process;
determine the quality of the write process based at least on a quantity of squeezed sectors; and
when the quantity of squeezed sectors is greater than a threshold quantity of parity sectors employed during write process, indicate the quality of the write process to the data protection node.

* * * * *